(12) United States Patent
Marrian et al.

(10) Patent No.: US 7,038,204 B2
(45) Date of Patent: May 2, 2006

(54) METHOD FOR REDUCING PROXIMITY EFFECTS IN ELECTRON BEAM LITHOGRAPHY

(75) Inventors: Christie Roderick Kingsley Marrian, San Jose, CA (US); Charles Thomas Rettner, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 10/855,096

(22) Filed: May 26, 2004

(65) Prior Publication Data

US 2005/0263722 A1  Dec. 1, 2005

(51) Int. Cl.
*H01J 37/304* (2006.01)

(52) U.S. Cl. .................................. 250/310; 250/492.2
(58) Field of Classification Search ............... 250/310, 250/492.2; 430/22, 30, 295, 296, 942
See application file for complete search history.

(56) References Cited

U.S. PATENT DOCUMENTS

| 4,323,638 | A | | 4/1982 | Adams et al. |
| 4,350,866 | A | | 9/1982 | Zasio et al. |
| 5,112,724 | A | * | 5/1992 | Bradshaw ............... 430/296 |
| 6,482,558 | B1 | | 11/2002 | Singh et al. |
| 6,512,237 | B1 | | 1/2003 | Nakasugi et al. |
| 2002/0177083 | A1 | | 11/2002 | Dobisz et al. |
| 2003/0146382 | A1 | | 8/2003 | Suzuki et al. |
| 2003/0203311 | A1 | | 10/2003 | Dobisz et al. |

FOREIGN PATENT DOCUMENTS

| GB | 1604004 | 12/1981 |
| JP | 55140229 | 11/1980 |
| JP | 57207338 | 12/1982 |
| JP | 58140120 | 8/1983 |
| JP | 61206223 | 9/1986 |
| JP | 61208830 | 9/1986 |
| JP | 1025416 | 1/1989 |
| JP | 1091422 | 4/1989 |
| JP | 01-283825 | 11/1989 |
| JP | 2192714 | 7/1990 |
| JP | 8029967 | 2/1996 |

OTHER PUBLICATIONS

Z.-J. Ding et al., "A Monte Carlo Modeling of Electron Interaction with Solids Including Cascade Secondary Electron Production", Scanning, vol. 18, 1996, pp. 92-113.
R. Shimizu et al., "Monte Carlo modelling of electron-solid interactions", Rep. Prog. Phys., 1992, pp. 487-531.

(Continued)

*Primary Examiner*—Kiet T Nguyen
(74) *Attorney, Agent, or Firm*—Daniel E. Johnson (57) ABSTRACT

An electric field is applied below a resist to reduce proximity effects associated with electron beam scattering, thereby improving the resolution of features or lines written into the resist. Although the electrons in the electron beam can be very energetic (e.g., >>10 keV), it is shown that even a small electric field can reduce the number of electrons that re-enter the resist material after being scattered in the substrate, and thus reduce the energy deposited in the resist from these electrons. One advantage of this technique is that high potentials and high fields are not required. Accordingly, the methods described can be applied to existing tooling with little modification to the electron beam system.

49 Claims, 5 Drawing Sheets

OTHER PUBLICATIONS

R. J. Hawryluk et al., "Energy dissipation in a thin polymer film by electron beam scattering*", Journal of Applied Physics, vol. 45, No. 6, Jun. 1974, pp. 2551-2566.

C. R. K. Marrian et al., "Modelling of electron elastic and inelastic scattering", Journal Vac. Science Technology B., vol. 14, No. 6, Nov./Dec. 1996, pp. 3864-3869.

* cited by examiner

METHOD FOR REDUCING PROXIMITY EFFECTS IN ELECTRON BEAM LITHOGRAPHY

TECHNICAL FIELD

The invention relates to electron beam lithography, and more particularly to a method of reducing proximity effects associated with electron beam scattering, in order to improve the resolution and fidelity of features or lines written into a resist material.

BACKGROUND

Electron beam lithography ("e-beam" lithography) involves exposing a film of polymer resist, which resides on a substrate, to a beam of electrons, thereby breaking the molecular chains of the exposed polymer. In the case of a positive resist, the exposed portions of the polymer have increased solubility with respect to a solvent, so that by bringing the solvent into contact with the exposed portions, selective dissolution or etching of the resist takes place to produce empty spaces such as trenches or voids in the resist. By filling the spaces with metal and then removing the remaining (unexposed) resist, metallic structures can be fabricated that are suitable for various microelectronic applications. Advanced photolithographic masks and test structures are generally fabricated using electron beam lithography.

Figure 1:
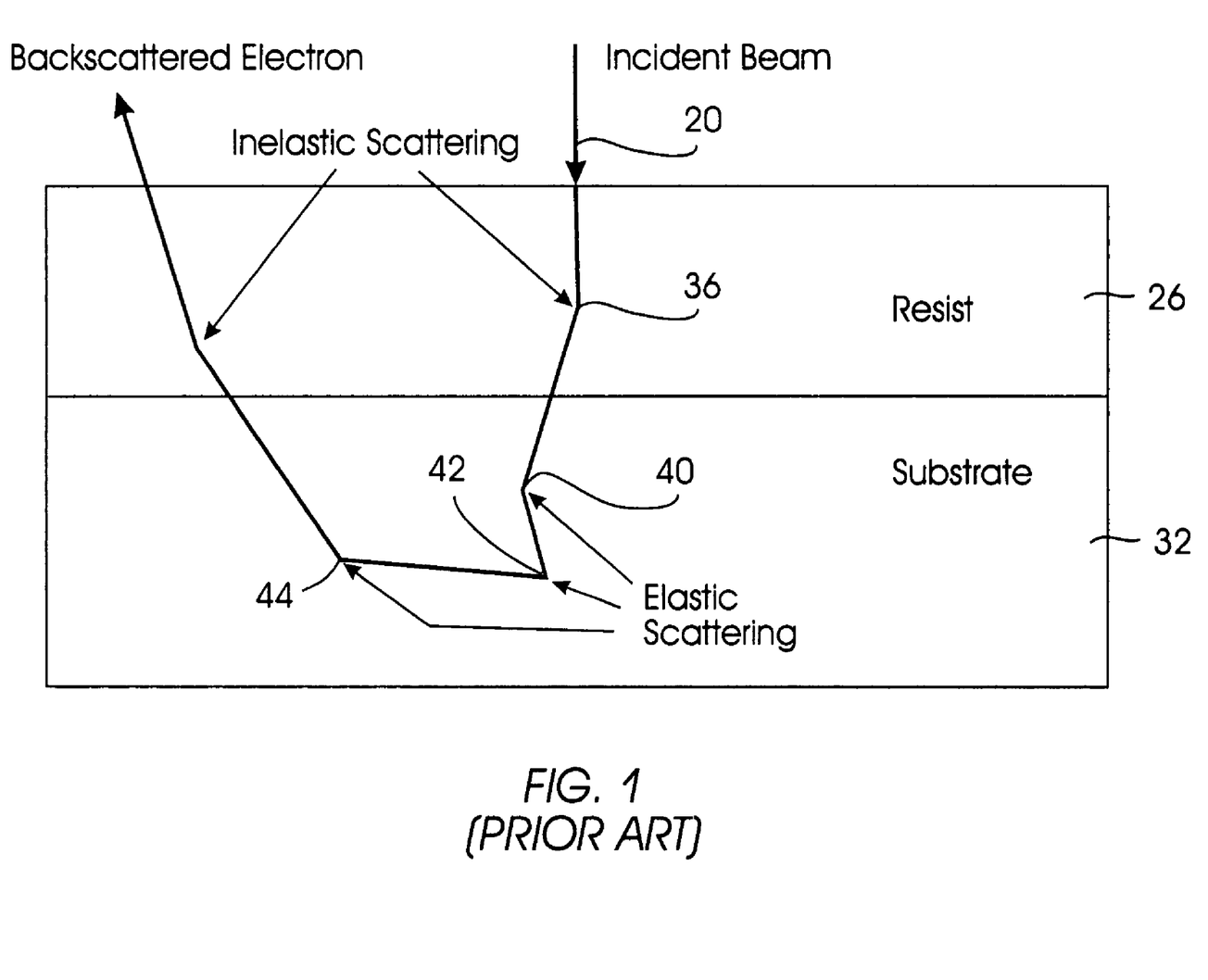
FIG. 1 illustrates how, in the prior art, electrons in an electron beam undergo inelastic and elastic scattering in a resist coated substrate, thereby leading to poor feature resolution.

Since the resist is sensitive to the deposition of energy resulting from interactions with electrons as they pass through the resist, the resolution achievable with electron beam lithography is, to a first approximation, limited by the spot size of the incident e-beam. In reality, however, electron scattering causes a broadening of the exposed region beyond the spot size. One form of broadening is known as "forward scattering", and occurs as the electrons scatter at small angles as they pass through the resist. This is illustrated in FIG. 1, which shows an incident e-beam 20 that enters a resist 26 located over a substrate 32. The incident beam 20 within the resist 26 experiences inelastic scattering events 36 (as well as elastic scattering events), which result in secondary electrons being created and the beam being deflected. The increase in effective beam diameter in nanometers due to forward scattering is given empirically by the formula $d_f = 0.9 (R_t/V_b)^{1.5}$, where $R_t$ is the resist thickness in nanometers and $V_b$ is the beam voltage in kilovolts. Thus, forward scattering can be mitigated by using the thinnest possible resist and the highest available accelerating voltage. Although this broadening effect is important for thick resists, it is relatively unimportant for thin resists at high beam energies. Moreover, the broadening that arises from this kind of scattering is often small compared to the intrinsic resolution of the resist.

A second, more vexing form of scattering involving electrons is also illustrated in FIG. 1. After the beam 20 has entered the substrate 32, it may undergo various elastic scattering events 40, 42, 44 (as well as inelastic scattering events), and recoil back through the substrate 32 at a large angle before returning to the resist 26. These so-called "backscattered" electrons arise as follows. Once the electrons of the beam 20 enter the substrate 32, they undergo a series of scattering events during which they lose energy before eventually coming to a stop. For the range of energies typically used in electron beam lithography systems, i.e., 20–100 keV, the total path length may be hundreds of microns. The electron scattering can be elastic, resulting in a change of direction, or it can be inelastic, resulting in both a change of direction and the creation of a secondary electron. Generally, the scattering angle is larger with elastic scattering than it is with inelastic scattering.

Moreover, between scattering events, the various energy loss processes experienced by an electron can be accurately described by a continuous energy loss mechanism (the so-called "continuous slow-down approximation"; see, for example, H. A. Bethe, Handbook of Physics, vol. 24, Springer, Berlin, 1933), which results in energy being deposited in the material through which the electron is moving. As a result of all these physical phenomena, the resist 26 will be "exposed"—and thereby have energy deposited in it—over a cross sectional area many orders of magnitude greater than just the spot size of the electron beam 20 where it enters the resist 26; this is often referred to as the cause of proximity effects. When defining complex patterns in a resist, the proximity effects must be corrected for by reducing the direct exposure, in order to maintain the degree of pattern fidelity (i.e., lack of deviation from the intended pattern) that is required for advanced prototyping and mask making. The distribution of energy deposited in the resist 26 as a function of distance from the incident beam spot can be simulated using Monte-Carlo methods.

There is a wealth of literature on Monte Carlo simulation techniques in books and journals, such as the Journal of Vacuum Science and Technology, in particular, each year's November/December issue. (See, for example, C. R. K. Marrian et al., J. Vac. Sci. Technol., B14, pp. 3864–3869, 1996; and D. F. Kyser and N. S. Viswanathan, J. Vac. Sci. Technol., vol. 12, pp. 1305–1308, 1975. See also R. J. Hawryluk et al., J. Appl. Phys., 45, p. 2551–2566, 1974; R. Shimizu et al., Rep. Prog. Phys., 55, pp. 487–531, 1992; and Z.-J. Ding et al., Scanning, 18, p. 92–113, 1996.) Numerous approaches have been employed to correct for proximity effects. However, they are all plagued by the fact that mathematically, the correction of proximity effects is an ill-posed problem, since a complete solution requires the application of negative exposure doses to the resist (i.e., conceptually, energy must be removed from the resist), which is physically unrealizable. This results in solutions being non-ideal and computationally extremely intensive, which is a problem that is exacerbated by the ever shrinking minimum feature sizes of micro and nano electronic circuits.

Exposure of the resist 26 to backscattered electrons ultimately limits the density at which small features can be written. To illustrate this, consider the case of forming an array of dots in a resist. To do this, the electron beam would be held long enough at a given dot position to achieve the desired exposure, and then moved on to the next dot position. As demonstrated by Kyser and Viswanathan (supra), however, it is known that each time such a dot position is exposed, the resist surrounding the dot position may experience an exposure equal to about $10^{-4}$ of the total dose (i.e., the total net deposited energy) out to a distance of more than 5 microns from the intended exposure site; this may be viewed as a "blurring" of the feature. As the density of dots is increased, however, to the point where the number of dots within a 5 micron radius approaches $10^4$, the indirect exposure ("blurring" effect) becomes comparable to the direct exposure. In this example, this point is reached as the dot spacing approaches 90 nm, for a square array. Attempts to further increase the density become increasingly difficult, as the processing window shrinks rapidly.

Accordingly, proximity effects severely limit the ability of electron beam lithography to form dense structures. One way to mitigate this problem would be to use membranes or extremely thin substrates. However, membranes have very limited applicability to microelectronics manufacturing, because they cannot be made large enough nor can they withstand the processing needed to form complex structures.

What is needed is a method of reducing proximity effects that can be employed on solid substrates. The present invention satisfies this need by significantly reducing the root cause of the problem, namely, the deposition of energy by electrons in the resist at positions away from the point of impact of the incident electron beam. This not only reduces the amount of extraneous exposure, but also the lateral extent over which it occurs, thereby significantly reducing the computation required for correction of the proximity effects in those cases where it is still required.

SUMMARY OF THE INVENTION

In preferred embodiments of the invention, electron-scattering induced proximity effects are reduced by applying an electric field in or near the region where the detrimental electron backscattering occurs. Based on intuition alone, one might assume that extremely high electric fields would be required, since the electrons in the e-beam can be very energetic (e.g., >>10 keV). However, the results of calculations are presented herein demonstrating that even a small electric field can reduce the number of electrons that re-enter the resist material after being scattered in the substrate or underlying structure, and thus reduce the energy deposited in the resist material from these backscattered electrons.

The success of this technique can be attributed to the fact that the backscattered electrons that reenter the resist have relatively low momentum normal to the resist/structure interface, even though the lateral momentum of the electrons may be high (i.e., the momentum parallel to the resist/structure interface). An electric field is introduced into the underlying structure whose field lines are oriented normal to the resist/structure interface. This produces a relatively small change in the velocity of the electrons but deflects them so that they do not reenter the resist. The result is that a significant reduction in the magnitude of the proximity effects can occur. One advantage of this technique is that high potentials and high fields are generally not required. Accordingly, the preferred methods described herein can be applied to existing tooling with little modification to the electron beam system. In addition, the potentials are sufficiently low that electron optical performance of the system is not degraded.

One aspect of the invention is a method that includes directing a beam of electrons across a resist to form a pattern in the resist, in which at least some of the electrons enter a structure that is underneath the resist, and in which at least some electrons are backscattered by the structure. The method further includes employing an electric field in at least a portion of the structure to reduce the number of backscattered electrons entering the resist. The pattern may advantageously be a latent lithographic pattern, in which the electric field is used to reduce feature blur in the pattern by reducing proximity exposure of the resist. The pattern may include at least one feature having a characteristic dimension between 10 nm and 100 microns, 30 nm and 5 microns, between 30 nm and 1000 nm, or between 30 nm and 100 nm. The electric field may advantageously extend from a surface of the structure to a distance of between 0.5 and 20 microns into the structure. Also, the electric field may be advantageously applied to the structure beginning at a depth of between 5 nm and 500 nm below the upper surface of the structure. The electric field is preferably oriented substantially perpendicular to a layer in which the resist resides. Also, the electric field advantageously deflects backscattered electrons so that they do not enter the resist; the electric field may reduce the percentage of backscattered electrons entering the resist by at least 30%, 50%, or even 90%.

In a preferred implementation of the method, the structure includes two conducting layers separated by an insulating layer, and an electric potential is applied across the two conducting layers. The insulating layer may become part of a desired patterned structure upon further processing; the insulating layer may be part of a bilayer resist structure that includes an imaging layer, in which a pattern is created by the electron beam in the imaging layer that is later transferred into the insulating layer. In a preferred implementation of the method, the structure may include a conductive or metal layer and a substrate material across which an electric potential is applied. In one preferred implementation of the method, a conductive film overlies the resist, and electric potential is applied between the conductive film and the structure, so that the electric field passes through the resist.

Another aspect of the invention is a method that includes directing an electron beam, which propagates in a first direction, onto a resist to form a latent lithographic pattern in the resist, while forming an electric field in proximity with the resist to inhibit electrons, which propagate in another direction, from entering the resist. The electrons that propagate in said another direction may advantageously be electrons from the beam that have been backscattered from a structure that underlies the resist.

Yet another aspect of the invention is a method that includes providing a layer of resist that is in contact with an underlying structure and applying an electric field to the structure. The method further includes writing a latent lithographic pattern into the resist with an electron beam, in which the strength and orientation of the electric field are selected to reduce backscattered electron flux entering the resist from the structure, thereby permitting an increase in the pattern's resolution.

Still another aspect of the invention is a method of modeling electron flux in a lithographic system that includes resist over a structure. The method includes modeling the interaction of an e-beam with the resist, in which an electric field in the structure is employed to reduce the flux of electrons entering the resist from the structure.

In other implementations, there are provided computer program products for carrying out any of the modeling methods disclosed herein.

BRIEF DESCRIPTION OF THE DRAWINGS

FIG. 2, which includes FIGS. 2A, 2B, and 2C, shows various structures in which an electric field is induced underneath a resist to reduce the flux of backscattered electrons entering the resist, and in which:

FIGS. 4, 5, and 6 show various structures in which an electric field is induced underneath a resist to reduce the flux of backscattered electrons entering the resist, and in which:

DETAILED DESCRIPTION OF THE INVENTION

Preferred implementations of the invention disclosed herein mitigate electron scattering effects that would otherwise make it difficult to achieve high resolution, well-defined features in resist material using electron beam lithography. By modeling the behavior of electron scattering by atoms in the substrate 32 (see FIG. 1), it is possible to demonstrate how applying an electric field to the substrate can mitigate deleterious scattering effects, thereby making it possible to improve the resolution of features formed in the resist 26. The scattering of electrons by atoms can be modeled by considering that both elastic and inelastic scattering of electrons can occur, and that both kinds of scattering affect the mean free path $\lambda$ of electrons propagating through a material. If the total elastic cross section and the total inelastic cross section are denoted by $\sigma^e$ and $\sigma^{in}$, respectively, then $$\lambda^{-1} = \{\Sigma_i N_i (\sigma_i^e + \sigma_i^{in})\} \quad (1)$$

in which the summation is over the different types of particles encountered by the electrons (with these different particle types having respective cross sections), and $N_i$ represents the number density of particles of type "i".

Modeling an electron's trajectory through a substance is most easily done by applying Monte Carlo statistical analysis, in view of equation (1) and accounting for energy losses arising from scattering. Essentially, the respective paths of a large number of electrons are generated using random numbers input into statistical models. This is a well known technique that is described in the literature and is accepted as an accurate physical description of the otherwise computational intractable problem of computing the energy deposited from the electron beam into the substrate. In addition, the specific code used herein has been exhaustively calibrated against experiment and has proven to be extremely accurate in determining the energy deposited by an energetic electron beam in a resist material overlying a variety of different substrate materials. Further details regarding one such Monte Carlo statistical approach that was used are given below.

Figure 2A:
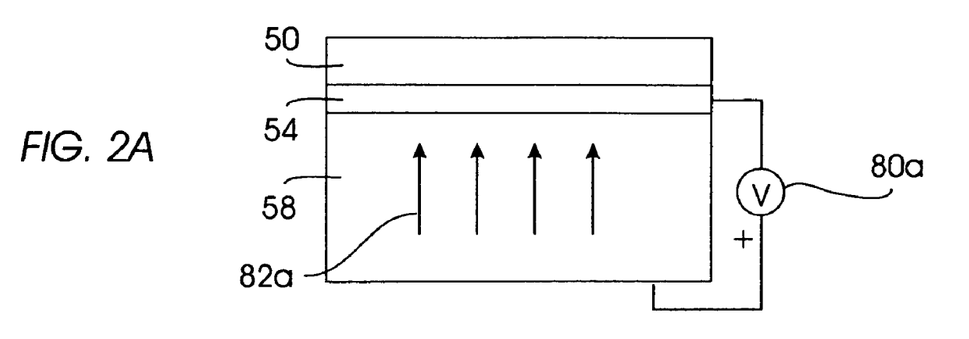
in FIG. 2A the electric potential is applied across an insulating substrate.
Figure 2B:
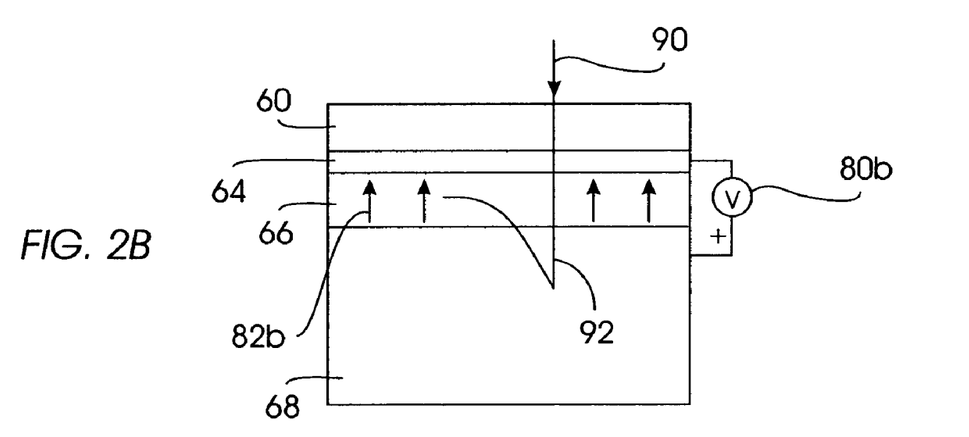
in FIG. 2B the electric potential is applied between a conductive layer and a non-insulating substrate; and in FIG. 2C the electric potential is applied between two non-insulating substrate materials.
Figure 2C:
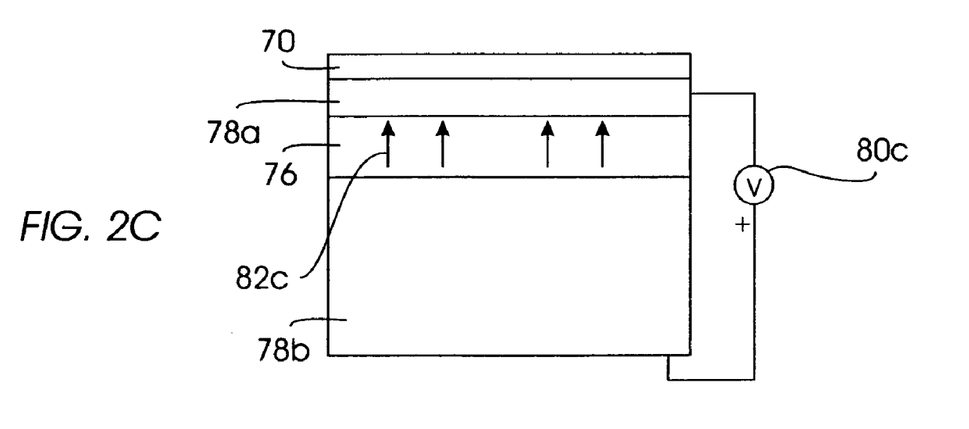

A number of simulations were run for a variety of incident electron energies of up to 100 kV for the configurations shown in FIGS. 2A, 2B, and 2C, and for a range of layer thicknesses for each of these configurations. The reduction in the electron scattering induced proximity effects has been found in all cases. There is every reason to believe that these proximity effects will be reduced in all cases involving energetic electron beams in substrates when an electric field is present at some point beneath the resist layer, including such substrates as silicon, amorphous $SiO_2$, quartz, GaAs, and silicon on insulator (SOI). FIG. 2A shows a resist 50 overlying a metal or conductive layer 54, which in turn overlies a substrate 58 that is preferably insulating. FIG. 2B shows the case in which a resist 60 overlies a metal or conductive layer 64, which overlies a material 66 that is preferably insulating (e.g., oxide) and that is in contact with a non-insulating substrate 68. FIG. 2C shows the case in which a resist 70 is in contact with a first non-insulating substrate material 78a (e.g., silicon), which in turn overlies a material 76 that is preferably insulating and that is in contact with a second non-insulating substrate material 78b.

Electric fields may be applied through voltage sources 80a, 80b, and 80c using simple connections, as shown in FIGS. 2A, 2B, and 2C, respectively. Even a small battery would suffice, since at most little current will flow; alternatively, the requisite electric potential could be supplied from a power supply. In each of FIGS. 2A, 2B, and 2C, a voltage source is applied to a portion of the underlying structure on which the resist resides. In FIG. 2A, an electric field is generated across the insulating substrate 58 by connecting leads to the conductive layer 54 and the underside of the substrate 58, which would be made conductive for this purpose by, e.g., depositing a thin conductive layer (not shown) on the underside. In FIG. 2B, an electric field is generated across the insulator 66 by connecting leads to the conductive layer 64 and the substrate 68. In FIG. 2C, an electric field is generated across the insulator 76 by applying the voltage source 80c to the two non-insulating substrate materials 78a and 78b. For clarity, electric field lines 82a, 82b, and 82c are shown in FIGS. 2A, 2B, and 2C, respectively. Note that the insulating materials 58, 66, and 76 may be replaced with materials that are at least partially non-insulating, provided that the voltage sources 80a, 80b, and 80c can provide sufficient current to maintain the desired electric field strength.

Figure 3:
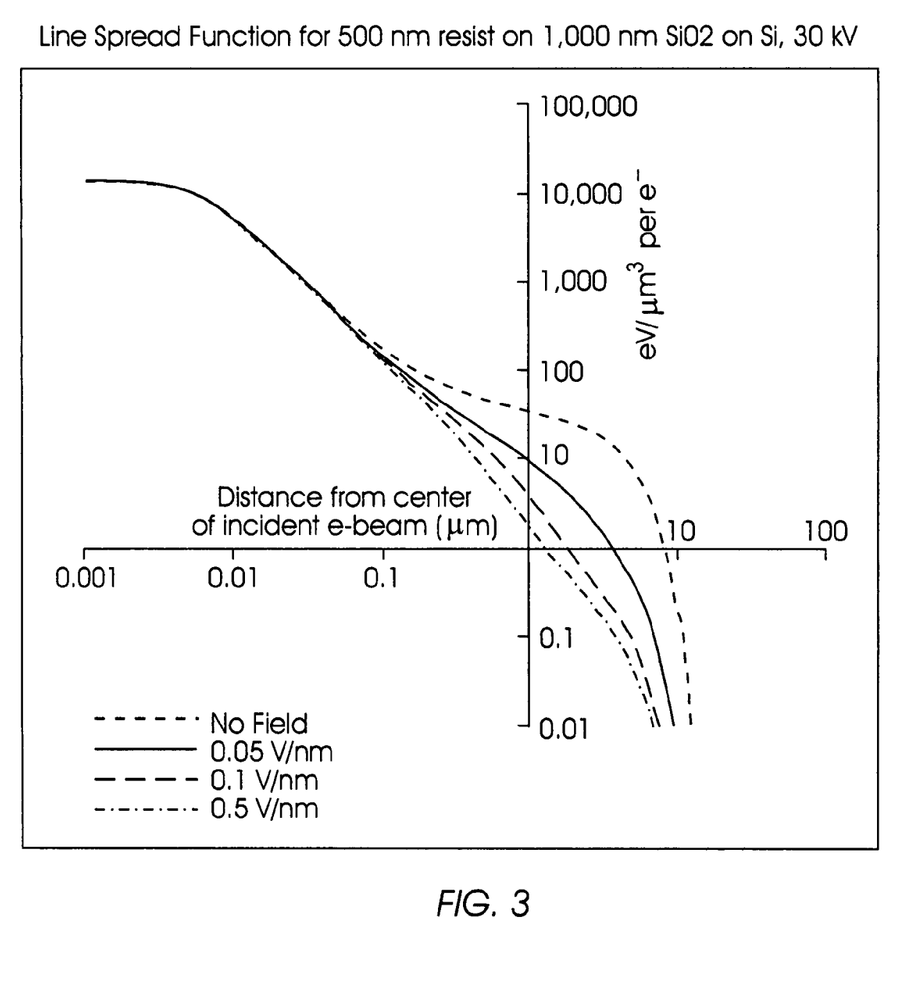
FIG. 3 presents the results of simulations that show how applying an electric field underneath the resist of FIG. 2B reduces the blur of features written by the e-beam.

One set of simulations is shown in FIG. 3, for which a 30 kV input electron beam of 10 nm diameter is directed onto a 500 nm thick resist layer that in turn overlies a 1 μm thick layer of $SiO_2$ on silicon. The simulations here were made with the configuration of FIG. 2B in mind, but with the conductive layer 64 being neglected (which is equivalent to assuming that the conductive layer 64 is at most about 10 nm thick). This figure shows a family of line spread functions corresponding to different electric field strengths underneath the resist layer. Note that FIG. 3 is a log-log graph of energy absorbed per unit volume of resist per incident electron (plotted along the y-axis) versus lateral distance (plotted along the x-axis), i.e., the distance measured in a plane perpendicular to the direction of the input electron beam, in which "zero distance" is taken to be the center of the input electron beam. Each curve in the figure can be thought of as the effective beam profile to which the resist is exposed as a result of electron scattering in the substrate. The uppermost curve in FIG. 3 is the effective beam profile for the prior art situation, in which no electric field is introduced. For this curve, significant exposure to the resist is observed at many microns from the center of the input electron beam. For dense feature patterns, extensive correction of proximity effects would be required, since the 10 nm diameter electron beam will be sensed by the resist material out to a lateral distance (as measured away from the center of the input electron beam) of several microns.

The other curves in FIG. 3 illustrate the effect of applying an electric field across the 1 μm SiO$_2$ layer. Even at 0.05 V/nm, it is clear that the dose to the resist is significantly reduced at lateral distances greater than 0.1 μm. Note that a relatively small potential, 50 V, is required to achieve this electric field across the 1 μm SiO$_2$ layer. The proximity exposure decreases further as the strength of the applied electric field is increased. However, an electric field of even modest strength provides substantial benefit and is expected to lead to a significant reduction in the amount of blur in the features written by the e-beam in the resist. Accordingly, by using an electric field in this way, the density of features that can be written into a resist can be substantially increased.

The reason believed to be responsible for this improvement is discussed with reference to FIG. 2B, by way of example. An electron beam 90 (not shown in FIGS. 2A, 2C, and 4, 5 and 6 below) is directed onto the resist 60, passes through the conductive layer 64 and the insulator 66, and continues on into the substrate 68. The electrons in the e-beam 90 may undergo scattering events similar to those illustrated in FIG. 1. One or more scattering events 92 in the substrate 68 redirect electrons back into the insulator 66 where they encounter the applied electric field represented by the field lines 82b. At this point, however, the electrons are deflected by the applied electric field. They may be deflected back into the substrate 68; they may give up their energy in the insulator 66, as shown in FIG. 2B; or they may reenter the conductive layer 64 or even the resist 60, where they may damage the resist. The effect of the applied electric field, however, is to mitigate the latter possibility, thereby improving the fidelity of the pattern written into the resist 60 by reducing proximity effects that otherwise lead to the blurring of features.

To apply an electric field beneath the surface of a photoresist being patterned, the underlying structure (or at least a portion of it) is preferably insulating. However, this is not as restrictive as one might think. First, masks patterned by e-beam lithography are usually made of quartz or glass, which is electrically insulating. Second, prototyping and test structures are often defined on structures that contain an insulating layer directly beneath or very close to the surface of the substrate material, as illustrated in FIGS. 2B and 2C, for example. Alternatively, a sacrificial insulating layer can be applied and removed after patterning, or it can be left as part of the substrate.

After the electric field is applied, performing electron beam lithography would otherwise proceed as normal. By way of example with respect to FIG. 2C, the resist 70 would be coated onto the (cleaned) substrate material 78a. The resist coated substrate material 78a would then be subject to a pre-exposure bake and loaded into the electron beam lithography system (not shown). The potential would be applied to the substrate material 78a, so that an electric field is generated across the insulating layer 76. The electron beam would be swept across the resist coated sample as required to generate the energy deposition profile predetermined by the design and control software of the lithography system. Following exposure, the sample would be removed from the lithography system and then heated or otherwise treated as appropriate for the given resist 70. The resist 70 would then be developed in the appropriate developer, resulting in either the removal of the exposed areas if a "positive" resist is used or the unexposed areas if a "negative" resist is used. The resulting pattern in the resist can then be used for a variety of pattern replication techniques, e.g., it can serve as an etch mask or be used for the lift-off of a deposited film.

The electric field is preferably applied in the region just beneath the surface of the resist-coated workpiece, which is then penetrated by the incident energetic electrons in the electron beam. The maximum depth penetrated (Grün range) is dependent on the energy Ep of the incident electron beam and is proportional to $Ep^{1.75}$. For 30 kV electrons, this range is about 15 μm in silicon; for 100 kV electrons, the Grün range is ~100 μm. However, in order to achieve the greatest reduction in backscattered electrons, the field is preferably applied as close to the surface of the workpiece as possible and over as large a depth into the workpiece as possible. By way of a specific example, applying a field of 0.1 V/nm over 1000 nm of a SiO$_2$ positioned directly underneath 500 nm of resist will reduce backscattered electrons by at least 90% at a lateral distance of 1000 nm away from a line source of 30 kV electrons.

While a field of 0.1 V/nm offers very substantial benefits in this example, a field strength of at least 0.01 V/nm or even 0.002 V/nm can still be used with distinct improvement over the no-field case (corresponding to the prior art). Fields of intermediate strength, such as 0.05 V/nm, may also be used. On the other hand, field strengths greater than 0.1 V/nm or 0.5 V/nm result in diminishing returns. Thus, the electric field strength may advantageously be in the range of between 0.002 V/nm and 0.5 V/nm, and is more preferably in the range of between 0.0002 V/nm and 0.1 V/nm. Alternatively, the electric field strength may advantageously be in the range of between 0.01 and 0.5 V/nm, and is more preferably in the range of between 0.01 and 0.1 V/nm. While in the above example the percentage of backscattered electrons is reduced by at least 90%, the electric field strength may be selected so that this percentage is at least 50%, or even at least 30%. The characteristic dimension of features or lines that may be produced using the methods herein may be at least as small as 10–30 nm, for example. This characteristic dimension may be, for example, in the range of between 10 nm and 100 microns, is more preferably in the range of between 30 nm and 5 microns, is still more preferably in the range of between 30 nm and 1000 nm, and is most preferably in the range of between 30 nm and 100 nm.

Electron beam lithography is generally used in semiconductor manufacturing for mask making and in direct write applications. In both cases, the workpieces may be readily adapted to include a region of electric field beneath the surface of the workpiece.

Mask Making Applications

For mask making applications the workpiece is generally electrically insulating, so that an electric field could be applied across the entire mask blank. To achieve the desired field, a potential of tens of kV might be required. However, the magnitude of the potential can be reduced by orders of magnitude if the workpiece is modified so that the field is only applied over the top few microns of the mask blank.

Figure 4:
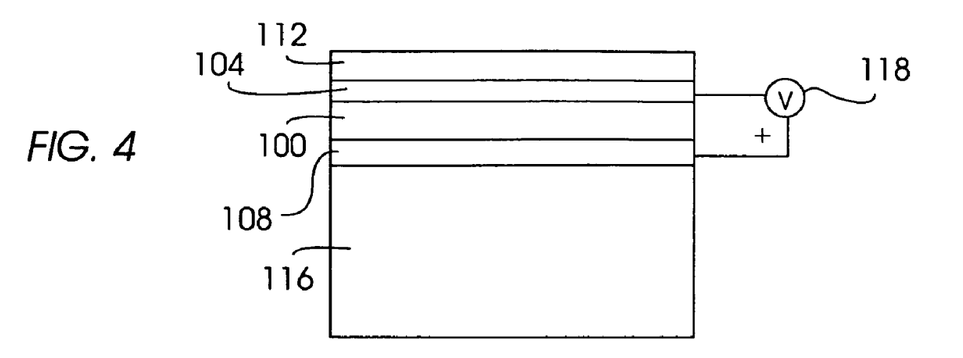
in FIG. 4 the electric potential is applied between a conductive mask material and a conductive layer.

FIG. 4 shows a structure for forming such a mask. The structure includes an insulating layer such as a silicon dioxide layer 100, which may range in thickness from 100 nm to 10 μm, with 1 μm being a preferred value. The silicon dioxide layer 100 is coated with a mask material 104, e.g., a thin metallic layer such as 15 nm thick Cr. On the backside of the layer 100 is a conductive layer 108, which is advantageously transparent to the wavelength of light for which the mask will be used, e.g., 50–60 nm of ITO (indium tin oxide) is a good choice for work with ultraviolet light. A resist material 112 (e.g., 500 nm thick) overlies the mask material 104, and the conductive layer 108 overlies a mask blank or substrate 116, such as 6 mm thick fused silica. A potential 118 would then be applied between the conducting layers 104 and 108 (which are positioned on the top and backside of the silicon dioxide layer 100, respectively) to produce, for example, an electric field of 0.1 V/nm (100 V/μm). The patterning of the mask material 104 is then performed in the standard way by displacing the electron beam over the surface of the workpiece to define the desired pattern in the resist material 112. The resist 112 is then developed and the pattern transferred by an etch process into the thin Cr layer 104.

The various layers of FIG. 4 may be deposited using standard chemical vapor deposition (CVD) or plasma enhanced chemical vapor deposition (PECVD) techniques. Note that the potential would be applied between the top Cr layer 104 and the buried conductive (ITO) layer 108 by making an appropriate contact to the buried conductive layer. This could be facilitated by simply masking the silicon dioxide layer 100 layer during the fabrication process to leave the conductive layer 108 exposed around the edge of the mask blank 116.

Direct Write Applications

A substrate containing a buried insulating layer is commonly used in the microelectronics industry, e.g., the class of materials known as silicon on insulator (SOI), which is commonly used as a substrate in semiconductor manufacturing. FIG. 2C shows such an arrangement, in which the substrate material 78a (e.g., silicon) overlies the insulator 76, which in turn overlies the substrate material 78b (which may include silicon). With SOI a contact is made to the back of the wafer (corresponding in this example to the underside of the substrate material 78b) using any standard technique for making an electrical contact to silicon. The substrate material 78b may be principally silicon but nevertheless conducting as a result of, for example, the implantation or diffusion of electrical dopants and/or the deposition of a thin conductive film such as nickel, molybdenum, aluminum, copper or tungsten on the backside of the substrate 78b. Contact may need to be made to the top silicon layer (corresponding in this example to the substrate material 78a) around the edge of the wafer. A potential is then applied to generate an electric field greater than 0.01 V/nm for 30 kV incident electrons, with 0.1 V/nm being a more typically preferred value.

Alternate Workpiece Configurations

Figure 5:
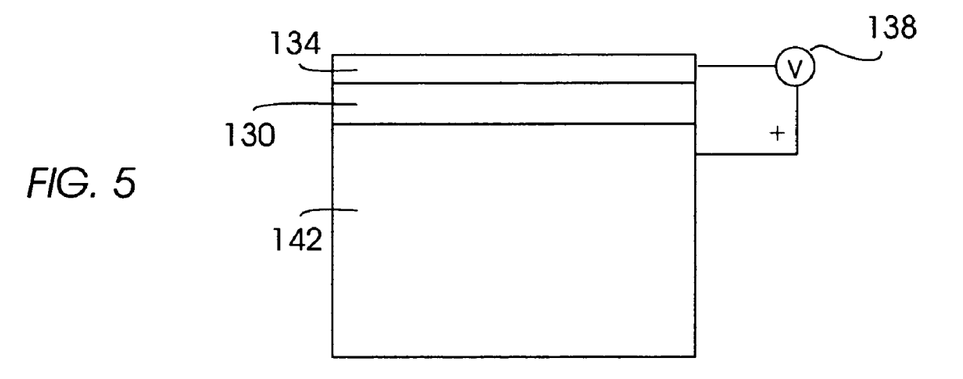
in FIG. 5 the electric potential is applied between a conductive film and a substrate; and in FIG. 6 the electric potential is applied between a thin conductive layer and a conducting substrate.

When it is not desirable to modify the workpiece or the workpiece is conducting, an electric field may be generated throughout the resist layer itself, although for many applications this may not be the preferred approach. One such example is shown in FIG. 5, which shows a single layer of resist material 130. A conductive film 134 is applied over the resist material 130. The film 134 may be used for charge deposition and can be a thin layer (~10 nm) of conductive polymer or metal, such as aluminum. An electric field is created by applying a potential 138 between the top resist layer 130 and a substrate 142 underlying the resist material 130. Electron beam lithography would then be performed in the standard manner followed by resist development and pattern transfer.

Figure 6:
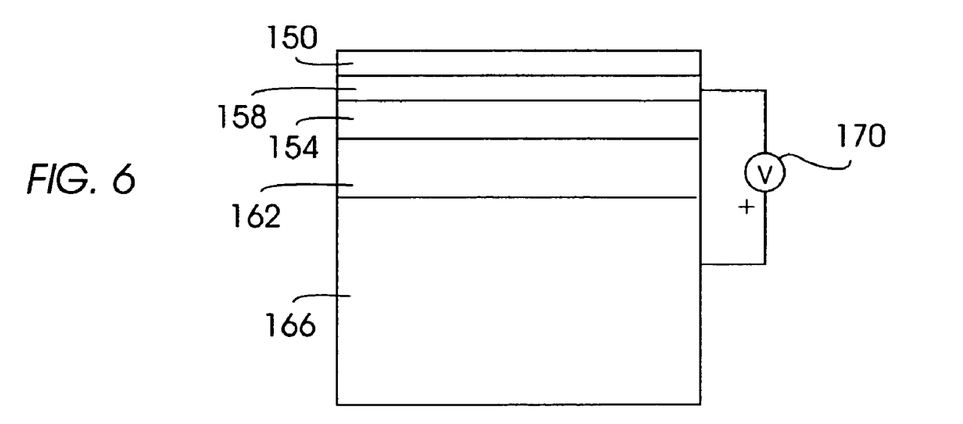

Yet another approach is outlined in FIG. 6, in which a bilayer resist is shown. A relatively thin imaging resist layer 150 is separated from a thicker resist layer 154 by a thin (e.g., ~10 nm) conductive layer 158 made of polymer or metal, for example. The thicker resist layer 154 is advantageously insensitive to irradiation from an energetic electron beam, and could be applied directly to an underlying conductive workpiece by, for example, spin coating. Alternatively, a CVD process could be used to deposit a suitable insulating film 162 of silicon oxide or nitride onto a conductive substrate 166. The thin conductive layer (polymer or metal) 158 would then be applied before the application of the thin imaging resist layer 150. Alternatively, a thin imaging resist layer could be applied before applying a conductive film. A potential 170 could be applied between the thin conductive layer 158 and the conductive substrate 166.

The patterning of the workpiece would then be performed in the standard way by displacing the electron beam over the surface of the workpiece to define the desired pattern in the top imaging resist layer 150. The resist would then be developed and the pattern transferred by an etch process into the underlying, thicker resist layer 154. Once the layers 150, 154 are patterned, they could then be used to transfer the pattern into the workpiece. The thicker layer 154 is preferably thin enough (e.g., a thickness of ~100 nm or less) to permit the end product to have reasonably good feature resolution.

Monte Carlo Code

Figure 7:
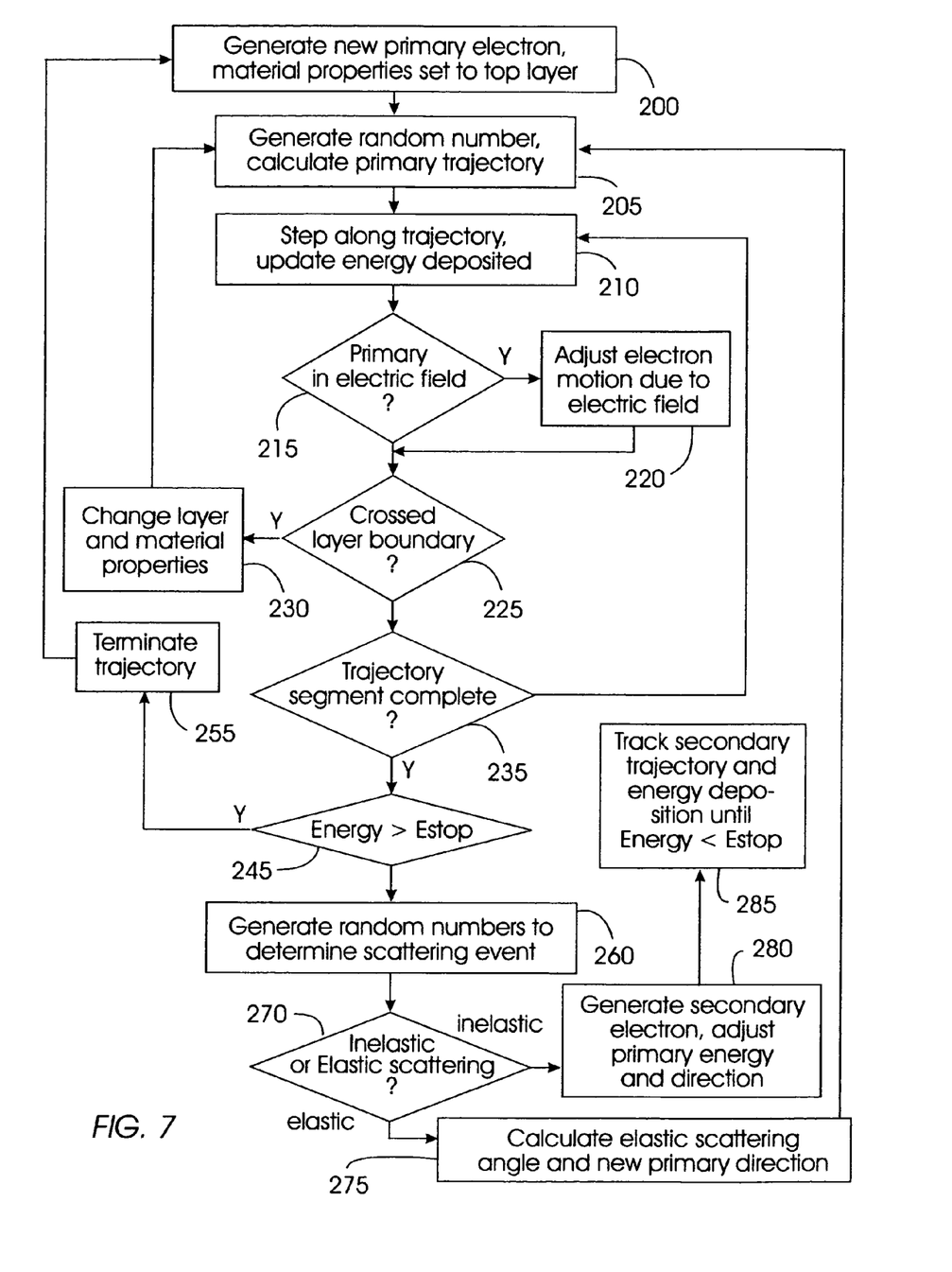
FIG. 7 is a flow diagram outlining important steps of Monte Carlo simulation code used to model how electrons in an electron beam interact with a resist.

FIG. 7 shows a flow chart of a Monte Carlo model that was used to generate the results of FIG. 3 and the other results presented herein. The model generates a primary electron (200) that is part of an electron beam incident on a multi-layered structure, which typically would include at least a resist layer and a substrate. This electron is considered to impact the top surface of the structure at a single point in space. A random number is then generated (205) for the purpose of calculating the distance traveled by the electron until it undergoes a collision with material in the structure. This distance is calculated from the random number and the mean free path of the electron in the material of the top layer of the structure. The electron is stepped along its trajectory (210), and if an applied electric field is present in that layer (215), the trajectory is adjusted accordingly (220). Thus, modeling steps 215 and 220 represent an enhancement over the prior art. At each step the energy lost by the electron is calculated by the continuous slow down approximation (see, for example, H. A. Bethe, supra), with this deposited energy being recorded as a function of position in the structure.

At each step along its trajectory, the position of the electron is checked to see if it has crossed into the next layer of the structure (225). If the electron has crossed a boundary between two layers, the material properties are updated for that new layer (230), and the distance traveled by the electron is determined accordingly. Otherwise, the electron's trajectory is tracked along the trajectory segment that has been calculated (235). If the electron energy is less than an "electron stop energy" chosen to be about a few hundred eV (245), then the trajectory calculation is terminated (255), and a new primary electron is generated. This value of a few hundred eV is selected to accelerate the computation and has not been found to result in unacceptably large errors; as a theoretical matter, electron propagation is possible even for arbitrarily small electron energy.

On the other hand, if the electron energy is greater than the preselected electron stop energy, then the nature of the next collision event is calculated by a random number (260), and expressions are called up or calculated for the elastic and inelastic cross section of an electron in the material in which the electron is located. If the collision is elastic (270), the new direction of the electron is calculated based on a further random number and expression for the elastic cross section (275). If the collision is inelastic (280), a discrete energy loss and a new electron direction are calculated by random numbers and expressions related to the inelastic cross section. This discrete energy loss is considered to generate a secondary electron that is tracked independently of the primary electrons (285), and the entire calculation procedure (steps 205–275) is repeated, except that secondary electrons do not create tertiary electrons through inelastic collisions (as called out in step 270).

The inelastic energy loss is considered to be deposited into the material at the position of the inelastic collision. The energy of the electrons is reduced at each step by the amount deposited into the structure. As mentioned above, the electrons are tracked until they reach some minimum energy ("electron stop energy"), which is typically on the order of 500 eV. At that point they are considered to move no further, and all their energy is considered to be deposited into the material at that position. Electrons can also leave the structure in which case they are no longer tracked. Electrons that leave back through the top of the substrate are called backscattered electrons. If the structure is thin, electrons can pass through the entire structure and are called transmitted electrons. After an electron has stopped, been backscattered or transmitted, a new primary electron is generated, and the Monte Carlo process of tracking the passage of an electron through the structure is repeated.

After tracking a large number (typically on the order of a million) of electrons, the results of the code are used to generate profiles of energy deposited in the structure. In electron beam lithography, the resist layer is usually the most important one, since this is the layer whose deposited energy profile determines the pattern exposed into the resist. FIG. 3 is one such example of energy deposition profiles. The model described herein has been validated in various ways, including comparing modeling results with experimental results and results from independently written Monte Carlo type simulation routines. The model's limitations become significant only at sub-10 nm dimensions with very well focused beams. At dimensions relevant for the work disclosed herein (>30 nm), the model's predictions are consistent with experimental results to within experimental error (typically a few %).

In preferred embodiments of the invention, there is provided media encoded with executable program code to effect any of the modeling methods described herein. This code contains executable instructions that may reside, for example, in the random access memory (RAM) of a processor, or on a hard drive or optical drive of a processor. The instructions may be stored on a magnetic or optical disk or diskette, a disk drive, magnetic tape, electronic read-only memory, or other appropriate data storage device. In preferred embodiments, this program code may be read by a digital processing apparatus such as a processor or computer for performing any one or more of the modeling methods disclosed herein.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

What is claimed is:

1. A method, comprising:
    directing a beam of electrons across a resist to form a pattern in the resist, wherein at least some of the electrons enter a structure that is underneath the resist, and wherein at least some electrons are backscattered by the structure; and
    employing an electric field in at least a portion of the structure to reduce the number of backscattered electrons entering the resist.

2. The method of claim 1, wherein the pattern is a latent lithographic pattern.

3. The method of claim 2, wherein the electric field is used to reduce feature blur in the pattern.

4. The method of claim 3, wherein the pattern includes at least one feature having a characteristic dimension between 10 nm and 100 microns.

5. The method of claim 3, wherein the pattern includes at least one feature having a characteristic dimension between 30 nm and 1000 nm.

6. The method of claim 3, wherein the pattern includes at least one feature having a characteristic dimension between 30 nm and 100 nm.

7. The method of claim 1, wherein the electric field is used to reduce proximity exposure of the resist.

8. The method of claim 1, wherein the electric field strength in said portion of the structure is between about 0.002 V/nm and 0.5 Volts/nm.

9. The method of claim 1, wherein the electric field extends from a surface of the structure to a distance of between 0.5 and 20 microns into the structure.

10. The method of claim 1, wherein the electric field is applied to the structure beginning at a depth of between 5 nm and 500 nm below the upper surface of the structure.

11. The method of claim 1, wherein the structure includes two conducting layers separated by an insulating layer, and an electric potential is applied across the two conducting layers.

12. The method of claim 11, wherein the insulating layer becomes part of a desired patterned structure upon further processing.

13. The method of claim 11, wherein the insulating layer is part of a bilayer resist structure that includes an imaging layer, and wherein a pattern is created by the electron beam in the imaging layer that is later transferred into the insulating layer.

14. The method of claim 1, wherein the structure includes a conductive layer and a substrate material across which an electric potential is applied.

15. The method of claim 1, wherein a conductive film overlies the resist, and electric potential is applied between the conductive film and the structure, so that the electric field passes through the resist.

16. The method of claim 1, wherein the electric field is oriented substantially perpendicular to a layer in which the resist resides.

17. The method of claim 1, wherein the electric field deflects backscattered electrons so that they do not enter the resist.

18. The method of claim 17, wherein the electric field reduces the percentage of backscattered electrons entering the resist by at least 90%.

19. The method of claim 17, wherein the electric field reduces the percentage of backscattered electrons entering the resist by at least 50%.

20. The method of claim 17, wherein the electric field reduces the percentage of backscattered electrons entering the resist by at least 30%.

21. A method comprising:
    directing an electron beam, which propagates in a first direction, onto a resist to form a latent lithographic pattern in the resist, while forming an electric field in proximity with the resist to inhibit electrons, which propagate in another direction, from entering the resist.

22. The method of claim 21, wherein the electrons that propagate in said another direction are electrons from the beam that have been backscattered from a structure that underlies the resist.

23. The method of claim 22, wherein at least 90% of the backscattered electrons that would otherwise enter the resist are deflected by the electric field.

24. The method of claim 22, wherein at least 50% of the backscattered electrons that would otherwise enter the resist are deflected by the electric field.

25. The method of claim 22, wherein at least 30% of the backscattered electrons that would otherwise enter the resist are deflected by the electric field.

26. The method of claim 21, wherein the strength of the electric field is between 0.0002 V/nm and 0.5 V/nm.

27. The method of claim 21, wherein the strength of the electric field is between 0.0002 V/nm and 0.1 V/nm.

28. The method of claim 21, wherein the strength of the electric field is between 0.01 V/nm and 0.5 V/nm.

29. The method of claim 21, wherein the strength of the electric field is between 0.01 V/nm and 0.1 V/nm.

30. The method of claim 21, wherein the pattern includes at least one feature having a characteristic dimension between 30 nm and 5 microns.

31. The method of claim 21, wherein the pattern includes at least one feature having a characteristic dimension between 30 nm and 1000 nm.

32. The method of claim 21, wherein the pattern includes at least one feature having a characteristic dimension between 30 nm and 100 nm.

33. A method, comprising:
providing a layer of resist that is in contact with an underlying structure;
applying an electric field to the structure; and
writing a latent lithographic pattern into the resist with an electron beam, wherein the strength and orientation of the electric field are selected to reduce backscattered electron flux entering the resist from the structure, thereby permitting an increase in the pattern's resolution.

34. The method of claim 33, wherein at least 90% of the backscattered electron flux that would otherwise enter the resist is deflected by the electric field.

35. The method of claim 33, wherein at least 50% of the backscattered electron flux that would otherwise enter the resist is deflected by the electric field.

36. The method of claim 33, wherein at least 30% of the backscattered electron flux that would otherwise enter the resist is deflected by the electric field.

37. The method of claim 33, wherein the strength of the electric field is between 0.0002 V/nm and 0.5 V/nm.

38. The method of claim 33, wherein the strength of the electric field is between 0.0002 V/nm and 0.1 V/nm.

39. The method of claim 33, wherein the strength of the electric field is between 0.01 V/nm and 0.5 V/nm.

40. The method of claim 33, wherein the strength of the electric field is between 0.01 V/nm and 0.1 V/nm.

41. The method of claim 33, wherein the pattern includes at least one feature having a characteristic dimension between 30 nm and 5 microns.

42. The method of claim 33, wherein the pattern includes at least one feature having a characteristic dimension between 30 nm and 1000 nm.

43. The method of claim 33, wherein the pattern includes at least one feature having a characteristic dimension between 30 nm and 100 nm.

44. A method of modeling electron flux in a lithographic system that includes resist over a structure, the method comprising:
modeling the interaction of an e-beam with the resist, in which an electric field in the structure is employed to reduce the flux of electrons entering the resist from the structure.

45. The method of claim 44, wherein the strength of the electric field is between 0.0002 V/nm and 0.5 V/nm.

46. The method of claim 44, wherein the strength of the electric field is between 0.0002 V/nm and 0.1 V/nm.

47. The method of claim 44, wherein the strength of the electric field is between 0.01 V/nm and 0.5 V/nm.

48. The method of claim 44, wherein the strength of the electric field is between 0.01 V/nm and 0.1 V/nm.

49. The method of claim 44, wherein the electric field is oriented substantially perpendicular to a layer in which the resist resides.

* * * * *